(12) United States Patent
Uimonen et al.

(10) Patent No.: US 9,778,899 B2
(45) Date of Patent: Oct. 3, 2017

(54) TECHNIQUES FOR SETTING VOLUME LEVEL WITHIN A TREE OF CASCADED VOLUME CONTROLS WITH VARIATING OPERATING DELAYS

(71) Applicant: INTEL CORPORATION, Santa Clara, CA (US)

(72) Inventors: Jaska Uimonen, Es (FI); Ismo Puustinen, Es (FI); Jan Ekstrom, Es (FI)

(73) Assignee: INTEL CORPORATION, Santa Clara, CA (US)

( * ) Notice: Subject to any disclaimer, the term of this patent is extended or adjusted under 35 U.S.C. 154(b) by 93 days.

(21) Appl. No.: 14/631,177

(22) Filed: Feb. 25, 2015

(65) Prior Publication Data

US 2016/0246564 A1    Aug. 25, 2016

(51) Int. Cl.
| | |
|---|---|
| *H03G 3/00* | (2006.01) |
| *G06F 3/16* | (2006.01) |
| *H03G 3/30* | (2006.01) |
| *H03G 3/02* | (2006.01) |
| *H03G 5/16* | (2006.01) |

(Continued)

(52) U.S. Cl.
CPC ............... *G06F 3/165* (2013.01); *H03G 3/02* (2013.01); *H03G 3/3005* (2013.01); *H03G 5/165* (2013.01); *H03G 9/005* (2013.01); *H03G 9/025* (2013.01)

(58) Field of Classification Search
None
See application file for complete search history.

(56) References Cited

U.S. PATENT DOCUMENTS

| | | | | |
|---|---|---|---|---|
| 2007/0286426 A1* | 12/2007 | Xiang | ................. | H04M 1/6016 |
| | | | | 381/17 |
| 2008/0212786 A1 | 9/2008 | Park | | |
| 2010/0211199 A1* | 8/2010 | Naik | ....................... | G10L 21/00 |
| | | | | 700/94 |

FOREIGN PATENT DOCUMENTS

| | | | |
|---|---|---|---|
| JP | 2008098694 A | 4/2008 | |
| JP | 2013223031 A | 10/2013 | |

(Continued)

OTHER PUBLICATIONS

International Search Report and Written Opinion received for PCT/US2016/014683. Date of mailing: Apr. 29, 2016, 9 pages.

*Primary Examiner* — Joseph Saunders, Jr.
*Assistant Examiner* — James Mooney
(74) *Attorney, Agent, or Firm* — Finch & Maloney PLLC

(57) ABSTRACT

Techniques are disclosed for synchronizing gain adjustments across a cascaded network of audio gain stages having variant operating delays. In particular, a delay-synchronized volume adjustment system configured in accordance with an embodiment of the present disclosure includes a controller operatively coupled to the cascaded network of audio and configured to apply gain adjustments in a synchronized manner that accounts for operating delays that are inherent to each gain stage. In an embodiment, the controller synchronously adjusts each gain stage relative to a corresponding operating delay such that gain adjustments fully propagate at substantially a same point in time within a given acceptable tolerance, and thus, eliminates or otherwise mitigates perceivable volume shifts when mixing audio from two or more audio sources.

20 Claims, 9 Drawing Sheets

(51) Int. Cl.
  *H03G 9/00*        (2006.01)
  *H03G 9/02*        (2006.01)

(56)         References Cited

FOREIGN PATENT DOCUMENTS

JP       2014068292 A       4/2014
KR      1019970012297       3/1997

* cited by examiner

TECHNIQUES FOR SETTING VOLUME LEVEL WITHIN A TREE OF CASCADED VOLUME CONTROLS WITH VARIATING OPERATING DELAYS

BACKGROUND

Modern electronic devices are often equipped to playback multiple audio streams by mixing the output of two or more audio pipelines, also referred to as audio sources. For example, a smartphone may be configured to playback music and, at some point in time while music playback is occurring, mix in a notification sound (e.g., an incoming call sound, message waiting indicator, chat message beep, and so on). To accomplish such multi-source playback, devices can include a shared gain stage that mixes sound signals from two or more audio sources, and outputs a resulting sound signal via a speaker. Each audio source can include a number of gain stages through which an audio signal can be generated, amplified, attenuated, or otherwise processed prior to playback via a speaker. Gain stages can be implemented in various ways, and can come packaged in one or more discrete chips with varying hardware clocks, operating systems, processing priorities and scheduling.

Figure 1A:
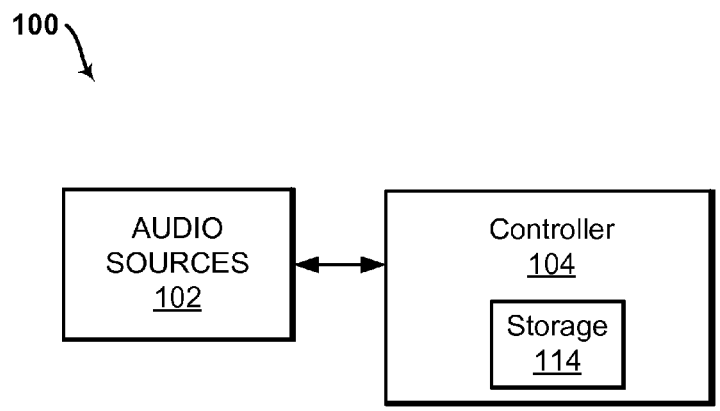
FIG. 1A illustrates a block diagram of a delay-synchronized gain adjustment system in accordance with an embodiment of the present disclosure.

These and other features of the present embodiments will be understood better by reading the following detailed description, taken together with the figures herein described. The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Techniques are disclosed for synchronizing gain adjustments across a cascaded network (tree) of audio gain stages having variant operating delays. In particular, a delay-synchronized volume adjustment system configured in accordance with an embodiment of the present disclosure includes a controller operatively coupled to a cascaded network of audio gain stages, and is configured to apply gain adjustments in a manner which accounts for operating delays that are inherent to each gain stage within the cascaded network of audio gain stages. The techniques disclosed herein manifest an appreciation that conventional gain adjustment approaches do not factor such variant operating delays associated with each gain stage when mixing two or more audio sources at a common point or stage. To this end, the playback of a first audio stream (e.g., music or other audio signals) can cause an undesirable upward volume shift (e.g., a perceivable volume spike) when a second audio stream (e.g., a notification sound) having a different volume level is mixed at the common (shared) gain stage. Without accounting for the operating delay of each gain stage in such circumstances, gain adjustments will propagate in an unsynchronized manner and unfortunately can startle or otherwise cause a sub-optimal listening experience for a user.

In an embodiment according to the present disclosure, the controller is configured to traverse the cascaded network of audio gain stages and acquire an operating delay for each gain stage. Once each operating delay is acquired, adjustments to each gain stage can be scheduled such that those gain stages having the longest latency periods are adjusted prior to gain stages with shorter latency periods. To this end, and in accordance with an embodiment, the controller synchronously adjusts each gain stage in a manner whereby all gain adjustments fully propagate at substantially a same point in time (within a given acceptable tolerance), referred to herein as a synchronization point, and thus eliminates or otherwise mitigates undesirable volume shifts.

In another embodiment, the controller is configured to determine or otherwise predict an operating delay for each gain stage of a cascaded network of audio gain stages. These predicted operating delays can be advantageously utilized in circumstances such as, for example, when a communication channel or bus to communicate with each gain stage/audio source is blocked, reserved, or otherwise unavailable. Once the predicted operating delays are determined, and in accordance with an embodiment, the controller can execute an optimistic prioritization scheme wherein downward gain adjustments are synchronized to momentarily reduce volume levels (e.g., of music or other audio) based on a worst-case estimate of how long downward adjustments may take to fully propagate. In addition, the controller can synchronously perform all upward gain adjustments based on their minimum predicted latency periods such that a notification sound (or other audio) becomes audible substantially at the point in time all downward adjustments have fully propagated, or soon thereafter. So, the controller can eliminate or otherwise mitigate undesirable audio volume spikes by causing a downward volume shift in a first source (e.g., music or other audio) in order to insure that a second audio source (e.g., a notification sound) is played back without causing an undesirable spike in volume levels.

It should be appreciated that terms such as "same point" and "synchronization point" and "synchronized manner" do not necessarily refer to or otherwise require an exact or precise instance in time by which adjustments will have fully propagated. Operating delays can vary during normal operation, and also over time due to aging and operating conditions (e.g., temperature, dust, humidity). To this end, and in accordance with an embodiment of the present disclosure, techniques herein contemplate such synchronization as being when a given plurality of adjustments are adjusted so that they fully propagate within an acceptable tolerance of one another. Such acceptable tolerances may be application-specific and can range from, for example, 0 ms to 100 ms or an allowable percentage of variance from the fastest propagation time to the slowest for a given multiple audio stream event (e.g., fastest volume adjustment propagation time is within 2%, 5%, 10%, 15%, 20%, or other suitable percentage of the slowest volume adjustment propagation time). In some cases, and to compensate for such unsynchronized or otherwise acceptable variations in propagation, techniques herein may anticipate a deviation of ±1%, 2%, 5%, 10%, 20%, or other anticipated deviation, from known/expected operating delays for each gain stage (or audio source). In these cases, determined or otherwise estimated deviations can be accounted for by proportionally increasing/decreasing expected operating delays to insure that volume adjustments fully propagate within a given acceptable tolerance. As will be further appreciated, the techniques can be implemented in various electronic devices capable of playing back two or more sound sources including, for example, smart phones, wearable computers, laptops, tablets, desktops, workstations, system-on-chip configurations, or other electronic devices that include cascaded networks of gain stages having variant operating delays. Example embodiments may be implemented in hardware, software, firmware, or any combinations thereof.

For instance, one specific example embodiment can be implemented within an electronic device to provide a delayed-synchronized gain adjustment system that prevents or otherwise mitigates a perceivable shift in audio when mixing an audio signal output by two or more audio sources. In one such embodiment, the delayed-synchronized gain adjustment system includes a controller configured to traverse a cascaded network of gain stages to acquire operating delays for each gain stage. In some cases, the controller acquires operating delays through communicating with each audio source (or each individual gain stage therein) using, for example, a physical data bus, a software interface, an application programming interface (API), or any suitable communication method as will be apparent in light of this disclosure. In other cases, the controller can acquire the operating delays through retrieving data representing a topology of the cascaded network of gain stages from a memory or other computer-readable medium. In still other cases, the controller can "learn" operating delays through, for example, empirical measurements or a combination of measurements and heuristic analysis. In any such cases, the controller can utilize the acquired operating delays to schedule gain adjustments in order to temporally synchronize those adjustments. This can be particularly beneficial when, for example, an audio signal output from a first audio sources (e.g., music, or other audio) is periodically mixed with an audio signal output from a second audio source (e.g., a notification sound). In an embodiment, the controller can schedule gain adjustments relative to the acquired operating delays such that each gain adjustment fully propagates at the same point in time (within an given acceptable tolerance), referred to herein as the synchronization point. So from a user's perspective, the perceivable volume level of music or other audio remains consistent even when additional audio signals from audio sources having variant operating delays are mixed at a common stage during playback.

Another specific example embodiment is implemented within an electronic device, wherein operating delays for each gain stage of a cascaded network of gain stages cannot be acquired or precisely determined. For example, in some cases a communication channel with each gain stage may be reserved or otherwise unavailable. In this embodiment, the controller can traverse the cascaded network of gain stages and estimate/predict a minimum and maximum latency period for each gain stage. During operation, the controller can eliminate or otherwise mitigate undesirable volume spikes by applying gain adjustments in an ordered or so-called "optimistic" manner whereby downward gain adjustments are prioritized and fully propagate at a common point in time (e.g., the synchronization point). In addition, this optimistic prioritization scheme also includes the controller synchronously scheduling upward gain adjustments such that a minimum latency period for each gain stage elapses at the synchronization point. It should be appreciated that such a prioritization scheme enables a user to perceive a brief downward shift in audio volume of a first audio source (e.g., music) followed by the output of a second audio source (e.g., a notification sound) becoming audible shortly thereafter. So, in some embodiments, a momentary downward shift in audio volume can be perceived by a user, but this momentary reduction of volume is preferable as an upward volume spike would otherwise be heard when a second audio source is started/stopped during playback of the first audio source.

Architecture and Operation

FIG. 1 illustrates a block diagram of a delay-synchronized gain adjustment system 100, in accordance with an embodiment of the present disclosure. As can be seen, the system 100 includes audio sources 102 communicatively coupled to a controller 104. Each of the audio sources 102 and the controller 104 can be implemented, for example, using discrete components that are populated on a suitable substrate such as a printed circuit board, or a number of substrates, as will be apparent in light of this disclosure. For example, the system 100, or portions thereof, can be integrated within a common package or housing, such as a system-on-chip (SOC) device. In any such cases, the controller 104 is operatively coupled to an output of the audio sources 102 to receive an audio signal for playback purposes, and to perform gain (volume) adjustments, as necessary. To this end, and as discussed below, the output volume of one or more gain stages within the audio sources 102 and the controller 104 can be individually adjusted or otherwise controlled. As will be appreciated in light of this disclosure, such fine-grain control enables the controller 104 to eliminate or otherwise mitigate audible volume shifts during propagation of gain adjustments across a cascaded network of gain stages having variant operating delays.

In some embodiments, the system 100 may be incorporated into a personal computer (PC or desktop), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, set-top box, game console, or other such computing environments capable of performing audio processing and playback.

Figure 1B:
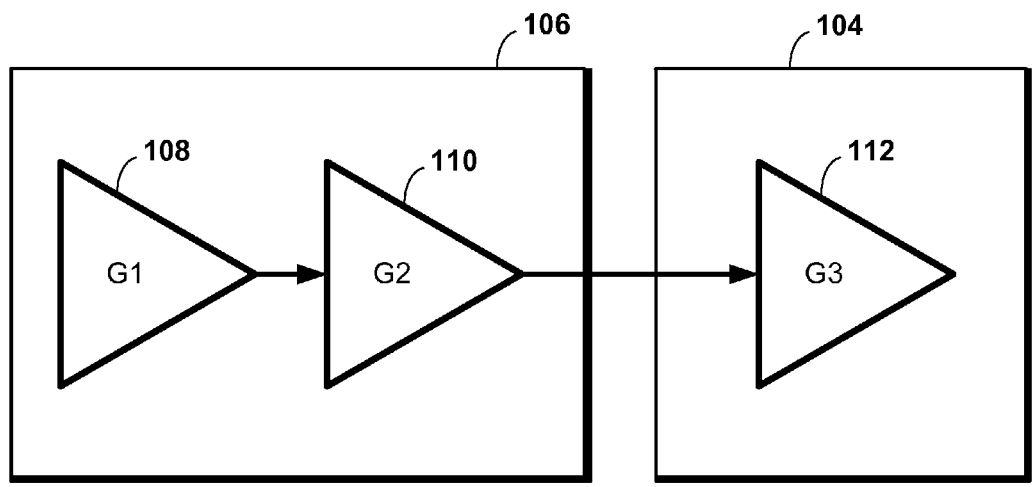
FIG. 1B illustrates an example audio source of the delay-synchronized gain adjustment system of FIG. 1A, in accordance with an embodiment of the present disclosure.

Controller 104 can be implemented as, for example, any processing module programmed or otherwise configured to adjust a volume level of an audio signal output by a given gain stage (e.g., gain stages 108, 110, and 112 of FIG. 1B). Some such specific implementations of controller 104 include, for example, a Complex Instruction Set Computer (CISC) or Reduced Instruction Set Computer (RISC) processors, x86 instruction set compatible processors, multi-core, or any other microprocessor or central processing unit (CPU). In some embodiments, controller 104 may comprise dual-core processor(s), dual-core mobile processor(s), and so forth. Storage 114 may be implemented, for instance, as a volatile memory device such as, but not limited to, a Random Access Memory (RAM), Dynamic Random Access Memory (DRAM), or Static RAM (SRAM). Storage 114 may be implemented, for example, as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In some embodiments, the controller 104 can include instructions that when executed cause a processor, such as the processor 810 of computing system 800 (FIG. 8) to carry out a process, such as processes 400 and 600 described below with respect to FIGS. 4 and 6. As will be further appreciated, controller 104 can be implemented with gate-level logic or purpose-built semiconductor configured to carry out similar functionality.

As should be appreciated, a gain stage can comprise any stage or point in an audio signal path where the gain (or level) of an audio signal can be adjusted or amplified. In a more general sense, this means that any component the audio signal passes through can include at least one gain stage, if not more, as the case may be. To this end, any place an audio signal encounters a level control can be accurately described as a gain stage. Accordingly, the term gain stage should not be construed as limiting the scope of this disclosure. In an embodiment, each gain stage can be controllable through, for example, a hardware bus or interface, software interface, wireless interface, or other suitable communication method, as will be apparent in light of this disclosure. Such control can include adjusting operating parameters to increase or decrease gain of an output audio signal. In addition, each gain stage may be configured to perform various additional signal processing routines including, for example, filtering, noise cancellation, and other types of digital/analog signal processing, and thus the controller 104 can be configured to selectively enable and/or adjust parameters pertaining to these signal processing routines as well.

Referring now to FIG. 1B, one example audio source 106 with multiple gain stages G1, G2 (volume controls) is shown, in accordance with an embodiment of the present disclosure. As shown, audio source 106 comprises a first gain stage 108 with an output communicatively coupled to an input of a second gain stage 110. Although only one specific audio source 106 is depicted, it should be appreciated in light of this disclosure that audio sources 102 can include a number of diverse audio sources, and a single audio source is depicted for ease of description. In addition, it should be further appreciated that each of the audio source 106 and the controller 104 can be configured with varying numbers of gain stages, and the particular number shown is not intended to be limiting. In an embodiment, a given audio source 106 can be implemented as, for example, hardware and/or software capable of generating an audio signal or stream for output to a speaker by later output stages. To this end, each given audio source 106 can comprise numerous hardware/software configurations, as will be apparent in light of this disclosure, and the various sources 106 provided need not be configured the same. For example, one given audio source 106 can comprise a microcontroller unit (MCU), a digital signal processor (DSP), integrated circuitry, and/or other suitable hardware. In the context of software, given audio source 106 can comprise a software audio stack capable of generating a suitable sound signal with some or all signal processing offloaded to dedicated hardware resources such as, for example, a sound card, a DSP, a MCU, a GPU, or integrated circuitry, just to name a few.

During operation, the audio source 106 generates an audio signal and outputs the audio signal to the controller 104. As shown, the controller 104 includes an endpoint or final stage (e.g., gain stage G3) for the pipeline (or path) formed between the audio source 106 and the controller 104. However, and in accordance with an embodiment, the final gain stage may be external to the controller 104. As shown in this example case, the third gain stage 112 is the final stage of the example audio path shown in FIG. 1B and can be operatively coupled to a speaker (not shown) to playback an audio signal. As discussed above, each gain stage 108, 110 and 112 can, for example, amplify, attenuate, filter, or perform various other signal processing routines and output a resulting audio signal. In addition, some gain stages may be configured to originate or otherwise produce a sound signal. In some such cases, the first gain stage 108 comprises a microcontroller and can be configured to retrieve a set of sound samples from a memory or other suitable computer readable medium to produce a sound signal having particular qualities (e.g., amplitude, stereo/mono signal). In addition, the microcontroller may be configured to generate various sounds at particular frequencies (e.g., beeps, continuous tones, or other generated sounds). In any such cases, the second gain stage 110 can receive the audio signal having a first gain level from the first gain stage 108. The second gain stage 110 outputs an audio signal to the third gain stage 112 of the controller 104, with that audio signal having a second gain level as controlled by the second gain stage 110. The controller 104 can be configured to perform additional level control (e.g., a master volume) that ultimately controls the decibel output of the signal output via a speaker of a device implementing the system 100. As discussed above, and in accordance with an embodiment, each of the gain stages 108, 110 and 112 can be individually adjusted or otherwise controlled by the controller 104 to insure, among other things, each component in the audio signal pipeline 101 is receiving and transmitting an audio signal in the optimum region of its dynamic range (e.g., without distortion, clipping, or an excess of noise). In some cases, this adjustment includes increasing some particular gain stages (e.g., to pull volume up) while decreasing others (e.g., to pull volume down).

As should be appreciated, each gain stage potentially introduces some amount of latency (delay) in an audio signal pipeline. This delay can be the result of various factors including, for example, different operating systems controlling audio generation, and different chips within a given audio signal path having dissimilar clocks and scheduling schemes, just to name a few. In addition, other potential contributors to latency include, for example, analog-to-digital conversion, buffering, digital signal processing, transmission time, digital-to-analog conversion, and other such computation or hardware-related latencies. However, and as will be discussed further below, audio latency for each gain stage can be predetermined, measured, or otherwise estimated. In addition, audio latency may be acquired via, for instance, a software method call, hardware bus, or other means of communicating with a gain stage, as will be apparent in light of this disclosure. In any such cases, and in accordance with an embodiment, a delay for each gain stage can be determined and advantageously utilized to selectively apply volume adjustments across a plurality of gain stages to insure volume adjustments propagate in a synchronized manner.

Continuing with the example embodiment shown in FIG. 1B, audio latencies don't present a particularly appreciable impact on user experience when a single audio source, such as audio source 106, is output by the controller 104 to a speaker. However, and as discussed below within the context of FIG. 2A, these latencies can adversely impact user listening experiences when an audio signal from a first audio source is mixed with an audio signal from one or more other audio sources at a common/output gain stage.

Figure 2A:
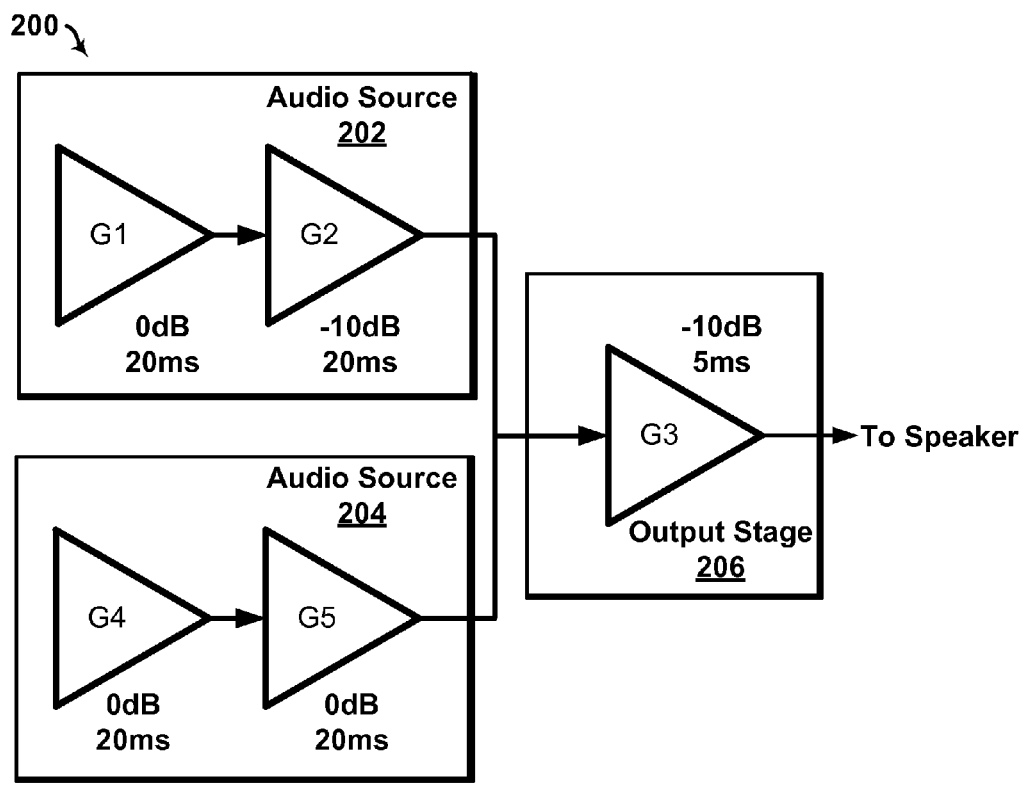
FIG. 2A illustrates a block diagram of an example cascaded network of audio gain stages.

Referring now to FIG. 2A, a block diagram depicting a plurality of audio sources comprising an example cascaded network of audio gain stages 200 is shown, in accordance with an embodiment of the present disclosure. As discussed above, audio sources are not limited to a particular number of gain stages and, for this reason, the configuration of the example audio sources 202 and 204, as well as the output stage 206, should not be viewed as limiting. As shown, the first audio source 202 includes a first and second gain stage (G1 and G2), and is communicatively coupled to a third gain stage (G3) of an output stage 206. In an embodiment, the output stage 206 comprises the controller 104 of FIG. 1A or other suitable controller. Also as shown, the second audio source 204 includes a fourth and fifth gain stage (G4 and G5) and is also communicatively coupled to the output stage 206 through the third gain (G3). As should be appreciated, the third gain stage (G3) of the output stage 206 enables each audio source 202 and 204 to be mixed and output to a speaker (not shown) of the device (e.g., computing device 800 of FIG. 8) implementing the cascaded network of audio gain stages 200.

Figure 2B:
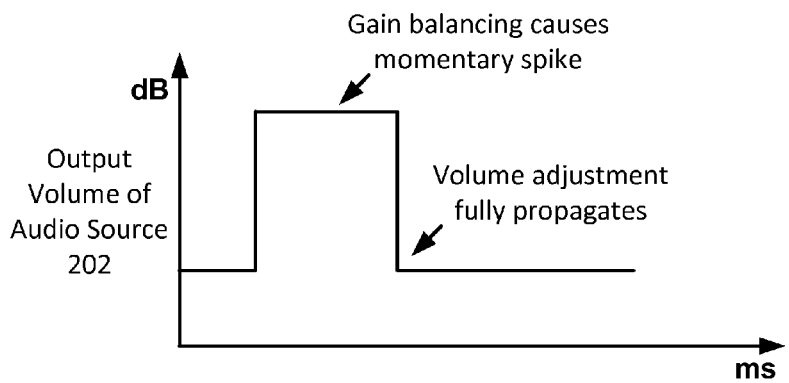
FIG. 2B illustrates an example timing diagram illustrating latency-related volume shifts during operation of the same while volume adjustment propagation occurs, in accordance with an embodiment of the present disclosure.

The behavior of gain stage operating latency in a multi-stream playback scenario utilizing a cascaded network of audio gain stages, such as network 200, can be better understood by way of example. Consider the cascaded network of audio gain stages 200 within the context of car audio. Within this context, music may be output by the first audio source 202 at a gain level of −10 dB, for example. The third gain stage G3 receives the audio output of the first audio source 202 and mixes that output with the audio signal output by the second audio source 204. In some cases, the audio signal output by the second audio source 204 can be periodic such that an audio signal is output only when, for example, a notification sound (e.g., a beep, an audible prompt, GPS turn-by-turn directions, and so on) is to be output to a user. As shown, the periodic introduction of such a sound signal results in the third gain stage (G3) receiving an audio signal from the second audio source 204 with a gain level different from that of the audio signal from the first audio source 202. A controller, such as controller 104 (FIG. 1A), monitors the relative gain levels of such audio signals at the third gain stage (G3) and balances respective levels, as necessary. For example, and as will be appreciated in light of this disclosure, the controller 104 can include a conventional gain balancing algorithm whereby each gain stage of the cascaded network of audio gain stages 200 is configured to receive and transmit an audio signal in the optimum region of its dynamic range (e.g., to prevent clipping and other distortion). To this end, the introduction of a 0 dB audio signal from the second audio source 204 at the third gain stage (G3) causes gains to be balanced such that the −10 dB audio signal is amplified (e.g., adjusted upward). While the controller 104 adjusts each gain stage to compensate (e.g., to prevent a perceivable audio shift), variant operating delays within each gain stage prevent an instantaneous/synchronized leveling. For instance, and as shown, the first audio source 202 includes gain stages having a 20 ms delay with the third output stage having a relatively fast latency of 5 ms. Recall that these two audio sources are mixed at a common gain stage (G3) which results in a momentary shift in volume as the higher gain level (0 dB) of the second audio source 204 causes the gain level of the first audio source 202 to increase. To this end, for this brief period of time (e.g., ~20 ms), the audio output level of the first gain stage 202 will spike until the gain adjustments applied by the controller 104 fully propagate through the cascaded network of gain stages 200. Albeit brief, such a volume shift can be characterized as a perceivable spike in music/audio volume that can startle or otherwise interrupt the listening experience of a user. After the brief period, volume adjustments propagate through the cascaded network of audio gain stages 200 and the music volume (e.g., the output of the first audio source 202) returns to substantially the previous level prior to the notification sound (e.g., the output of the second audio source 204). FIG. 2B illustrates a timing diagram illustrating this behavior and depicts an upward volume shift (a spike) in output volume of the first audio source 202 until the gain adjustments are fully propagated.

Figure 3A:
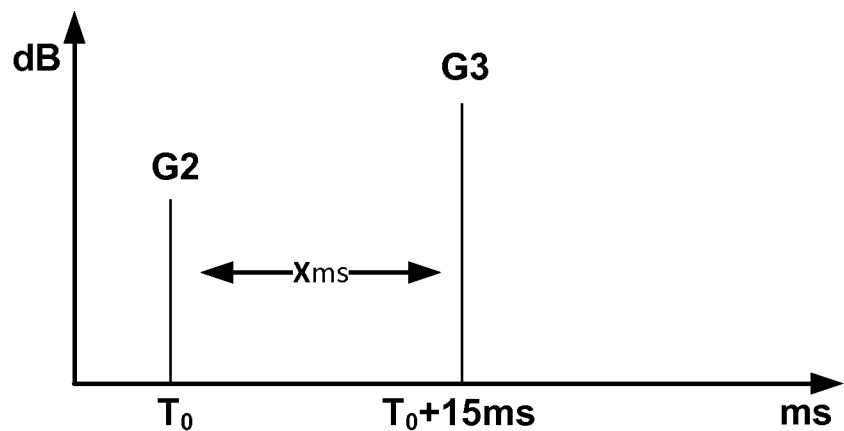
FIGS. 3A-3B, respectively illustrate example timing diagrams showing a sequence of delay-synchronized gain adjustments applied to gain stages of an audio source of the cascaded network of gain stages of FIG. 2A, and a constant overall decibel level output by the audio source as a result of such delay-synchronized gain adjustments, in accordance with an embodiment of the present disclosure.

In some embodiments disclosed herein, the controller 104 is configured to eliminate or substantially mitigate such volume shifts (e.g., volume spikes) due to variant operating delays in a cascaded network of audio gain stages. In an embodiment, the controller 104 can traverse the network of gain stages to determine an operating delay (latency period) for each gain stage. In some cases, each latency period can be "learned" through, for instance, measurements or through a combination of measurements and heuristic analysis. In other cases, each latency period can be received by communicating with each gain stage (or audio source) through a hardware bus, an API, or other suitable communication means, as will be apparent in light of this disclosure. In any such cases, and as shown in FIG. 3A, these delays may be utilized by the controller such that adjustments to gain stages can be applied in a synchronized fashion whereby adjustments are delayed relative to each respective latency period. For example, and as shown, FIG. 3A depicts two example gain stages G2 and G3, and their relative output audio signal volume levels. Referring to the previous example of FIG. 2A, the output gain stage G3 has a relatively shorter operating delay that gain stage G2 (5 ms versus 20 ms). To this end, the controller 104 can initially apply a first gain adjustment to gain stage G2, and then after a period of time (Xms) can apply a second volume adjustment to gain stage G3. In an embodiment, the delayed adjustment of gain stage G3 enables all volume adjustments to fully propagate in a synchronized fashion.

Figure 3B:
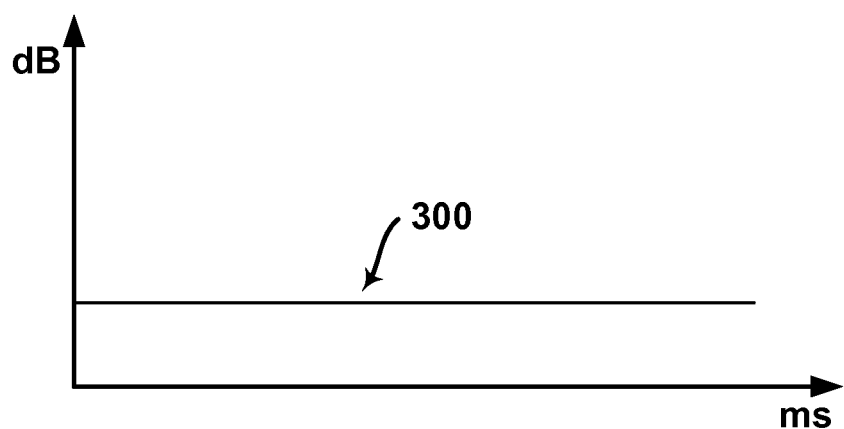

In more detail, and referring back to the specific example embodiment of FIG. 2A, the controller 104 can apply the adjustment to gain stage G2 at $T_0$ and then apply the adjustment to gain stage G3 15 ms later at $T_0+15$ ms (e.g., 20 ms−5 ms=15 ms) in order to cause gain adjustments to propagate and complete at substantially the same time. In a more general sense, the controller 104 can utilize the audio latency values to apply adjustments in a manner whereby volume adjustments fully propagate throughout a network of cascaded gain stages in a synchronized fashion, and thus, prevent a perceivable shift in audio levels as gain adjustments occur. In contrast with the upward volume shift depicted in FIG. 2B, FIG. 3B illustrates the constant output decibel level 300 of the first audio source 202 even after an additional audio signal (e.g., the second audio source 204) with a different volume level is mixed at the output stage 206. As shown, the controller 104 can delay gain adjustments relative to the operating delays of each gain stage such that the decibel level 300 of the first audio source 202 remains substantially constant. Stated differently, because gain adjustments propagate substantially at the same point in time (within a given acceptable tolerance), no perceivable change in volume level can be perceived. So, from a user's perspective the volume level of music or other audio remains consistent even when an additional audio signals having different gain levels are mixed into an audio pipeline with variant operating delays.

In another embodiment, the controller 104 can estimate or otherwise determine a potential range of operating delays for each gain stage of a gain stage network. In this embodiment, the controller 104 may not have the benefit of measuring operating delays or a communication channel to receive the same from each gain stage. To this end, the controller 104 can traverse the network of gain stages and estimate a range of latency periods for each gain stage. In an embodiment, the controller 104 can eliminate or otherwise mitigate undesirable volume shifts by applying volume adjustments in an ordered or so-called "optimistic" manner whereby downward gain adjustments are prioritized over upward gain adjustments. For instance, the controller 104 orders each gain stage of a network of gain stages into two categories: gain stages to be adjusted upwards and gain stages to be adjusted downwards. Those gain stages to be adjusted downwards can be ordered from most latent (e.g., highest operating delay) to least. Those gain stages to be adjusted upwards can be ordered from the longest minimum latency period to the shortest. In accordance with an embodiment, the controller 104 then utilizes these orderings to apply volume adjustments such that the downward adjustments are applied with sufficient delay so as to insure those downward adjustments have substantially propagated prior to applying upward adjustments. At the same time, the controller 104 synchronously adjusts the gain upwards on those gain stages that optimistically won't propagate gain adjustments until some minimum latency period has elapsed. Thus the controller 104 can synchronize gain adjustments such that all downward adjustments occur no later than a particular point in time (e.g. the synchronization point), and all upward adjustments optimistically occur no sooner than at the synchronization point. It should be appreciated in light of this disclosure that this optimistic ordering can result in a dip in audio levels versus a spike in audio as discussed above with regard to FIG. 2A. While an audio level dip can be perceivable to a user, such a dip can be preferable to an audio spike as it is unlikely to startle or otherwise distract a user (e.g., while operating a car or other vehicle).

Methodology and Architecture

Figure 4:
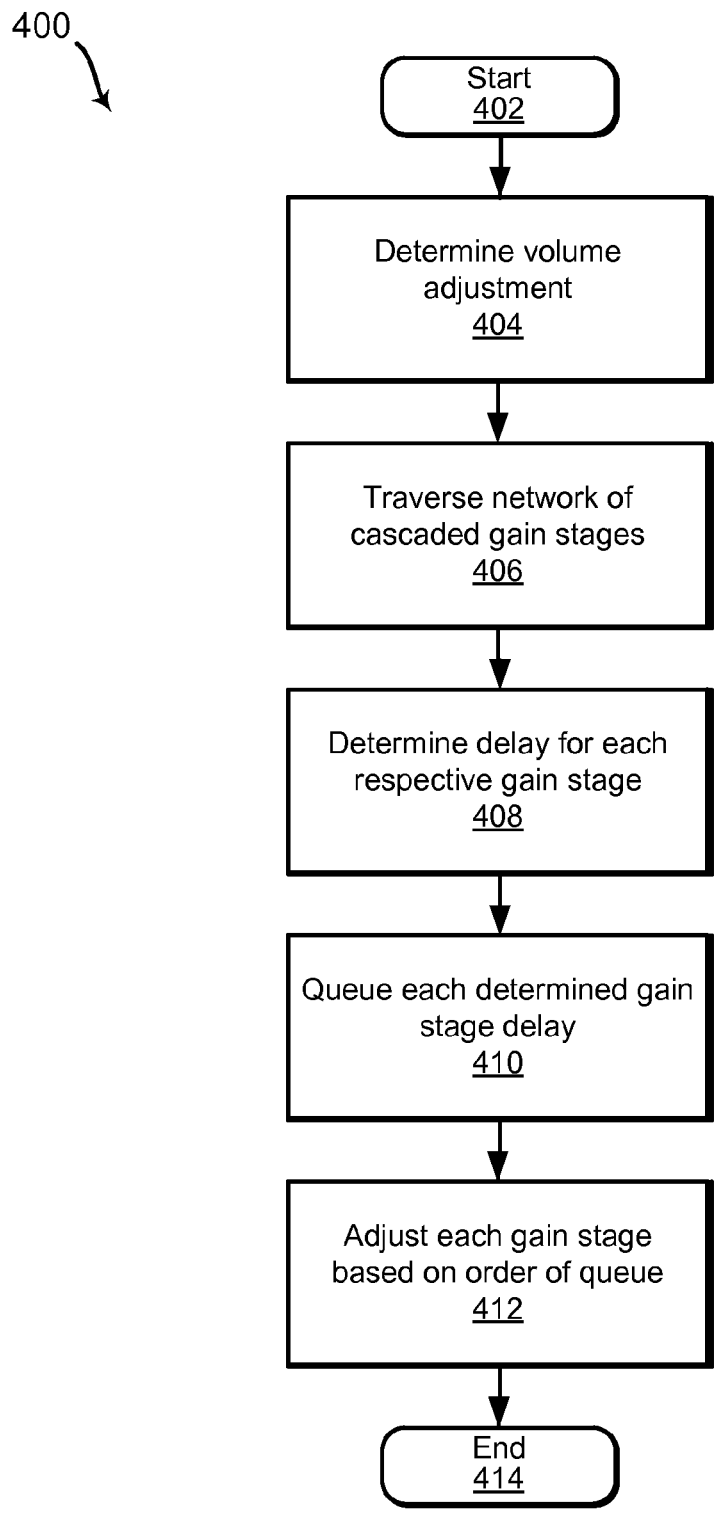
FIG. 4 illustrates an example methodology for applying delay-synchronized gain adjustments to a cascaded network of gain stages, in accordance with an embodiment of the present disclosure.

FIG. 4, with additional reference to FIGS. 1A and 2A, illustrates an example methodology 400 for synchronizing volume adjustments in a cascaded network of gain stages, in accordance with an embodiment of the present disclosure. The methodology may be implemented, for example, by the controller 104 of FIG. 1A. As can be seen, the method 400 includes acts of determining a volume adjustment, traversing a network of cascaded gain stages, determining a latency period for each gain stage of the cascaded network of gain stages, ordering each gain stage in a queue relative to each respective operating delay, and adjusting each gain stage such that volume adjustments are temporally synchronized across the cascaded network of gain stages. Method 400 begins in act 402.

In act 404, the controller 104 determines a volume or level adjustment of one or more gain stages of the cascaded network of gain stages 200 is needed. As discussed above, the controller 104 can determine such adjustment, for example, because one or more additional audio sources are mixed at the output stage 206 (e.g., to play a notification sound over music or other audio). In one particular example, a primary or first audio source (e.g., audio source 202) outputs an audio signal having a first decibel level. The introduction of an additional audio source mixed at a common gain stage (e.g., third gain stage G3 in FIG. 2A), causes the controller 104 to adjust gain levels throughout the cascaded network of gain stages 200.

In act 406, the controller 104 traverses the network of cascaded gain stages, such as the network 200. In some cases, traversing includes the controller 104 initially retrieving data from memory or other computer-readable medium (e.g., storage 114) representing the topology of the network 200. In addition, traversing can include the controller 104 communicating with each gain stage via a hardware bus, software interface, API, or other suitable communication method to acquire each operating delay, as will be apparent in light of this disclosure. In any such cases, an operating delay for each respective gain stage of the network of gain stages is determined in act 408. In some cases, the operating delay for each gain stage may be represented in milliseconds, microseconds, or other representation with suitable precision.

In act 410, the controller 104 orders each gain stage by their respective operating delay in a queue, list, register, or other suitable memory structure. In an embodiment, the controller 104 orders the operating delays such that the gain stages with the longest latency periods are first or otherwise most prominent (e.g., descending order). In act 412, the controller 104 adjusts each gain stage in accordance with the order of the queued operating delays. As discussed above with regard to FIG. 1B, adjusting each gain stage includes individually controlling each gain stage through, for example, a hardware bus, software interface, or other suitable method as will be appreciated in light of this disclosure. In general, the controller 104 can iterate through the queue and adjust each gain in relation to $T_0$ as calculated by the equation:

$$T_{Adjust} = T_{LongestLatency} - N_{Latency} \qquad \text{Equation (1)}$$

where ($T_{Adjust}$) is the time offset from $T_0$ at which a given stage will be adjusted, ($T_{LongestLatency}$) is the longest latency period of a gain stage, and ($N_{Latency}$) is the latency period of the given gain stage. One specific example implementation of this synchronized timing scheme discussed above is discussed in further detail below with regard to FIGS. 5A and 5B. The methodology 400 ends in act 414.

Figure 5A:
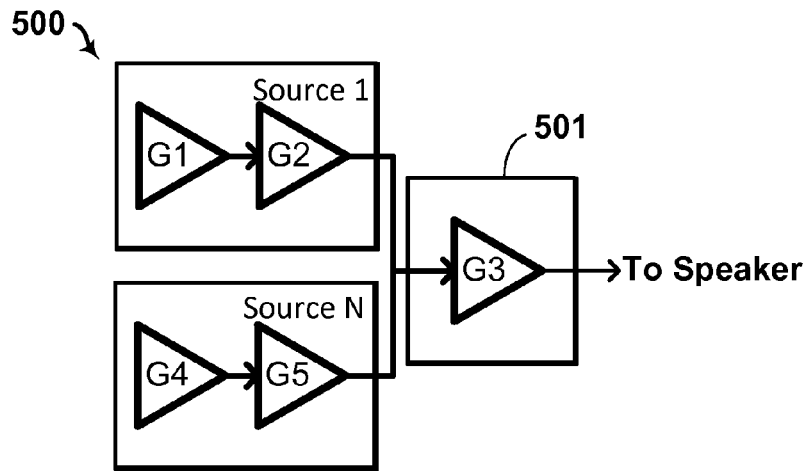
FIGS. 5A-5B respectively illustrate an example cascaded network of gain stages and a timing diagram for the same showing a delay-synchronized application of gain adjustments utilizing the methodology of FIG. 4, in accordance with an embodiment.
Figure 5B:
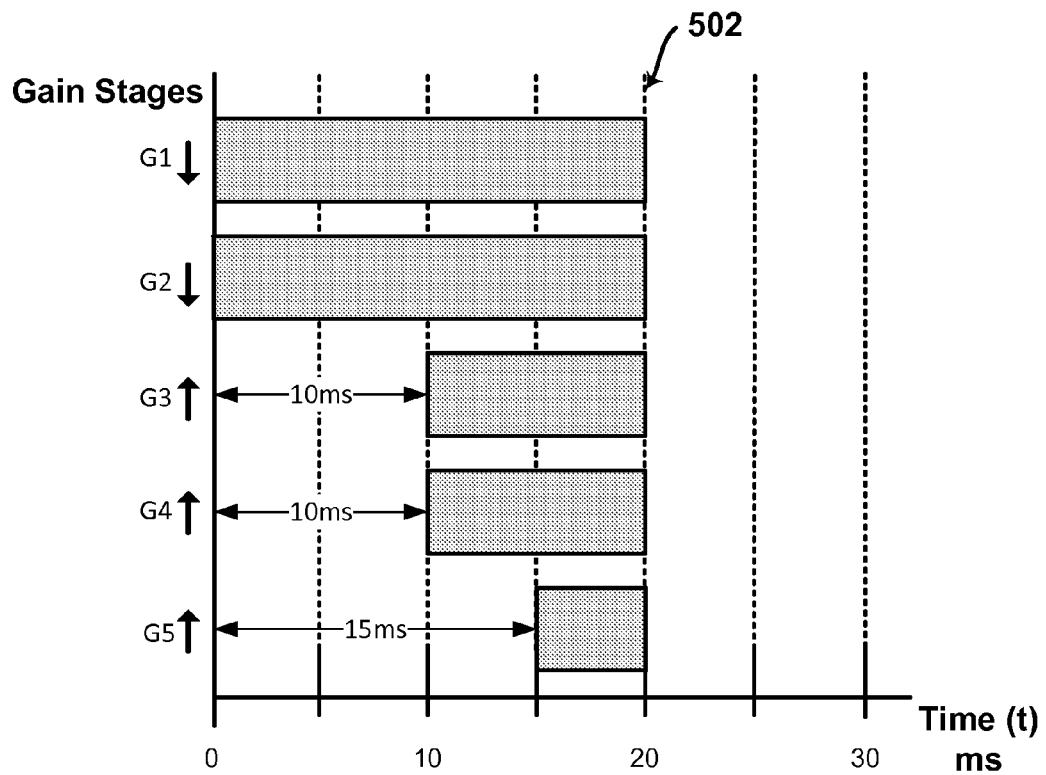

Now referring to FIGS. 5A and 5B, an example cascaded network of gain stages 500 is depicted in addition to an example timing diagram showing a delay-synchronized volume adjustment of the same utilizing the methodology 400 of FIG. 4, in accordance with an embodiment of the present disclosure. As shown, the network 500 includes a plurality of audio sources including source 1 through source N mixed at a common stage 501. In an embodiment, the common stage 501 can comprise the controller 104 of FIG. 1A. As discussed above, techniques disclosed herein are not limited to a particular number of audio sources, or gain stages per source, and the embodiment shown in FIG. 5A should not be considered limiting. In addition and as previously discussed, each audio source can be a combination of hardware and/or software, as will be apparent in light of this disclosure.

FIG. 5B depicts a plurality of gain adjustments applied to each gain stage of the network of cascading gain stages 500 with respect to time (t), in accordance with an embodiment of the present disclosure. It should be appreciated that the direction of the adjustment (upwards/downwards) is relative to the circumstances preceding the volume adjustments. For instance, when source N is mixed at common gain stage G3 (e.g., at $T_0$) the controller 104 determines which gain stages to adjust upwards and which to adjust downwards, according to the particular circumstances, to insure each gain stage is operating within its optimal dynamic range and to insure consistent audio levels output by the speaker. One such example act of determining volume adjustments is discussed above with regard to act 404 of FIG. 4. Continuing the example shown in FIG. 5B, at $T_0$ (or earlier) the controller 104 traverses the cascaded network of gain stages 500 in accordance with acts 406-408 to determine a respective operating delay for each gain stage G1-G5. In accordance with act 410, the controller 104 queues each gain stage adjustment in descending order based on the determined operating delays. In accordance with act 412, the controller 104 adjusts the volume of an audio signal output at each gain stage at an offset from $T_0$ as calculated in Equation (1). For example, and as shown, this includes adjusting some gain stages at $T_0$ while delaying adjustment of others relative to their respective operating delays. Also as shown, gain stages G3 and G4 are adjusted at $T_0$+10 ms (e.g., 20 ms−10 ms=10 ms). In addition, gain stage G5 is adjusted at $T_0$+15 ms (e.g., 20 ms−5 ms=15 ms). To this end, the techniques disclosed herein enable synchronization of gain adjustments whereby all adjustments are completed by synchronization point 502. So, as shown, the methodology 400 of FIG. 4 enables synchronized volume adjustments across a network of cascaded gain stages having variant delays such that substantially no perceivable volume shift can be perceived by a user during propagation of those volume adjustments.

Figure 6:
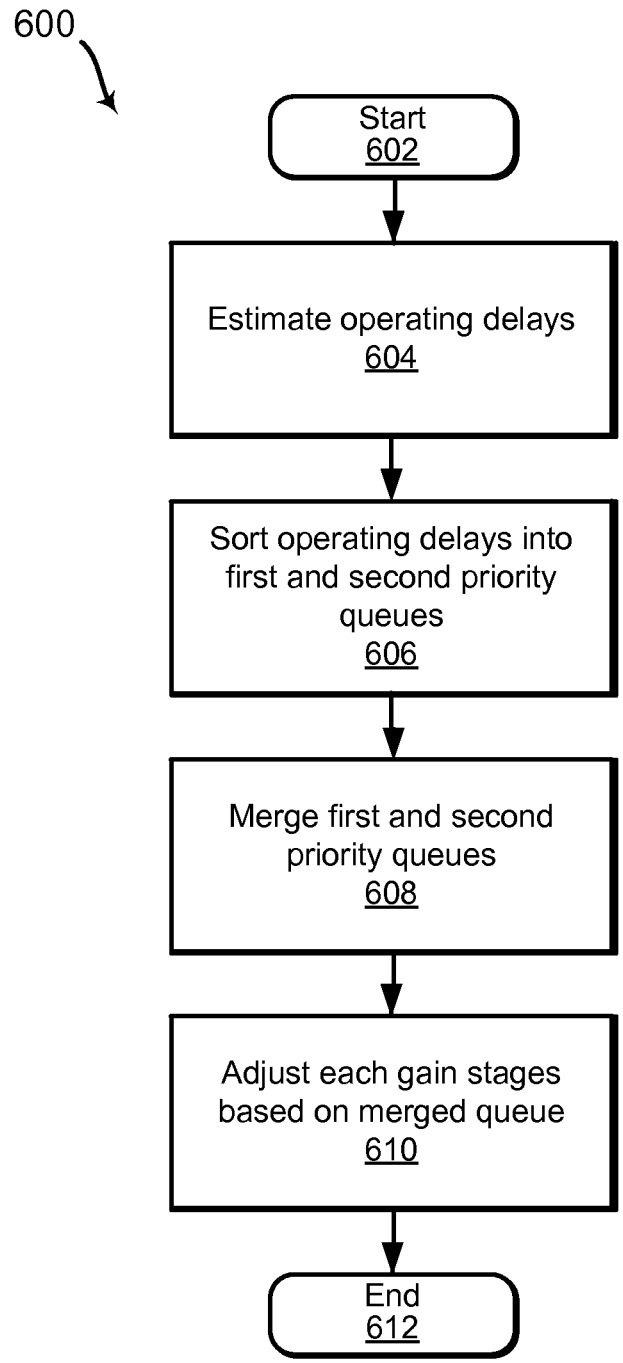
FIG. 6 illustrates another example methodology for applying delay-synchronized gain adjustments to a cascaded network of gain stages utilizing predicted latency periods for each respective gain stage, in accordance with an embodiment of the present disclosure.

FIG. 6, with additional reference to FIGS. 1A and 2A, illustrates another example methodology 600 for synchronization of volume adjustments in a cascaded network of gain stages utilizing predicted operating delays for each respective gain stage, in accordance with an embodiment of the present disclosure. The methodology 600 may be implemented, for example, by the controller 104 of FIG. 1A. As can be seen, the method 600 includes acts of estimating operating delays for each respective gain stage of a network of cascaded gain stages, sorting each respective gain stage by the direction of its volume change into a first priority queue for upward gain adjustments and a second priority queue for downward gain adjustments, merging the first and second priority queues, and adjusting each gain stage relative to the order of the merged queue. Method 600 begins in act 602.

In act 604, the controller 104 estimates operating delays for each gain stage of a cascaded network of gain stages, such as the network 200 of FIG. 2A. As discussed above, in some cases inter-chip communication may be blocked or otherwise prevented, and thus, requiring the controller 104 to determine an estimated or predicted operating delay for each respective gain stage. In some cases, these operating delays may be based on published specifications, theoretical predictions, and/or through empirical measurements. In any such cases, these predicted latency periods may be predetermined and stored, for example, in a memory or other computer-readable medium of a device implementing the system 100. In an embodiment, each respective estimated latency period can comprise a range including the minimum predicted period before a gain adjustment is effectuated and the maximum predicted period before a gain adjustment is effectuated. To this end, these ranges can be utilized to optimistically determine how long before a gain adjustment is likely to be perceivable, and how long before the adjustment will fully propagate. For example, the controller 104 can prioritize downward gain adjustments utilizing their worst-case (e.g., maximum) latency periods, thus allowing downward gain adjustments to fully occur prior to an upward gain adjustment. The point at which downward gain adjustments are optimistically determined to have fully propagated is generally referred to herein as the synchronization point. In a general sense, this synchronization point is the point in time which gain levels have been sufficiently pulled down, and upward gain adjustments can occur without an undesirable upward volume shift (e.g., a volume spike). So, these predicted latency ranges enable an optimistic synchronization of gain stages by the controller 104, as the maximum latency predictions can be utilized to prioritize all downward gain adjustments and to delay upward gain adjustments to the extent necessary to prevent upward volume shifts until substantially the synchronization point.

In act 606, predicted latency periods determined in act 604 are used to arrange each gain stage into one of two priority queues: a first priority queue for gain stages to be adjusted downwards and a second priority queue for stages to be adjusted upwards. Recall that because the controller 104 does not have precise operating delays for each gain stage, the controller 104 prioritizes downward gain adjustments so that, in a worst case, a downward volume shift is perceived (thus avoiding an undesirable upward volume spike). To this end, the maximum predicted latency period of those gain stages to be adjusted downwards can be utilized as a point in time (e.g., the synchronization point) the controller 104 can optimistically predict that all downward adjustments will have fully propagated. In an embodiment, each priority queue is sorted relative to the change time of each gain stage therein. More particularly, within the first priority queue (e.g., the downward adjusting queue) the gain stages are sorted in descending order with the gain stage having the longest maximum latency period being near the top (e.g., highest priority). Within the second priority queue (e.g., the upward adjusting queue) the gain stages are also sorted in descending order with the gain stage having the longest minimum latency period being nearer the top of the queue (e.g., highest priority). In act 608, the controller 104 merges the first and second priority queues into one final priority queue. In an embodiment, this final merged priority queue maintains the position of each gain stage. So, within the merged queue the downward gain adjustments with the longest maximum latency periods are nearer the top of the queue (e.g., higher priority) with those upward gain adjustments with the longest minimum latency periods. Likewise, those downward gain adjustments with the shortest maximum delay are nearer the bottom of the queue (e.g., lower priority) with those upward gain adjustments with the shortest minimum latency periods.

In act 610, the controller 104 adjusts each gain stage in accordance with the order of the queued operating delays similar to that of act 412 of FIG. 4. In an embodiment, and as discussed above, latency periods are estimated/predicted such that the worst-case amount of time (e.g., maximum predicted latency period) is utilized to allow downward adjustments to fully propagate prior to upward gain adjustments. To this end, the worst-case amount of time becomes the synchronization point. The upward adjustments of gain stages occur relative to that synchronization point such that these upward gain adjustments are performed at a specific point in time whereby their minimum predicted latency period elapses substantially at the synchronization point. Stated differently, because the controller 104 can reasonably predict that an upward gain adjustment will take at least the minimum predicted latency period, the controller 104 can schedule those upward gain adjustments such that the minimum latency period elapses substantially at the synchronization point, and thus, insure that no increase in volume level will be audible until substantially at the synchronization point, or shortly thereafter.

In one embodiment, the controller 104 can schedule each gain stage adjustment relative to the synchronization point. For example, each downward adjustment can be scheduled to be performed based on the calculation:

$$T_{Adjust} = -N_{Latency} \qquad \text{Equation (2)}$$

where ($T_{Adjust}$) is the time offset from $T_0$ (e.g., the synchronization point) at which a given stage will be adjusted and ($N_{Latency}$) is the maximum predicted latency period of the given gain stage. The upward adjustments are applied using a different timing scheme, with each gain stage adjustment being performed at a point in time relative to the synchronization point as calculated by:

$$T_{Adjust} = -N_{Latency} \qquad \text{Equation (3)}$$

where ($T_{Adjust}$) is the time offset from $T_0$ at which a given stage will be adjusted and ($N_{MinLatency}$) is the minimum predicted latency value of the given gain stage. Each gain stage is adjusted at a point in time such that the minimum predicted latency period elapses substantially at the synchronization point. To this end, the controller 104 can optimistically expect that upward adjustments to gain stages will propagate substantially at the synchronization point or shortly thereafter. Stated differently, each gain stage to be adjusted downwards is given enough time to fully effectuate level changes, with those changes being fully effectuated at the synchronization point (e.g., $T_0$). Recall that the synchronization point, in a sense, is a worst-case prediction for how long it will take to adjust the gain stages downwards. At the same time, because upward gain adjustments can be predicted to occur between a minimum and maximum predicted latency period, the minimum predicted latency period can be utilized to effectuate upward gain adjustments prior to the synchronization point. To this end, the upward adjustment of gain stages can be delayed or otherwise scheduled to occur synchronously with the downward adjustments, but only delayed to the extent necessary to insure that the minimum predicted latency period elapses before the synchronization point. So, the techniques disclosed herein enable undesirable upward volume shifts (e.g., volume spikes) to be eliminated or otherwise mitigated by momentarily pulling down the volume. One specific example implementation of this optimistic synchronized timing scheme discussed above is discussed in further detail below with regard to FIGS. 7A and 7B.

Figure 7A:
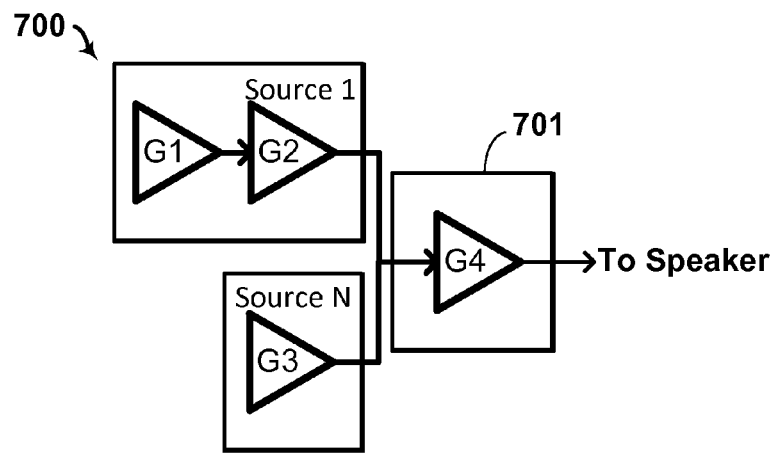
FIGS. 7A-7B respectively illustrate an example cascaded network of gain stages and a timing diagram for the same showing a delay-synchronized application of gain adjustments utilizing the methodology of FIG. 6, in accordance with an embodiment of the present disclosure.
Figure 7B:
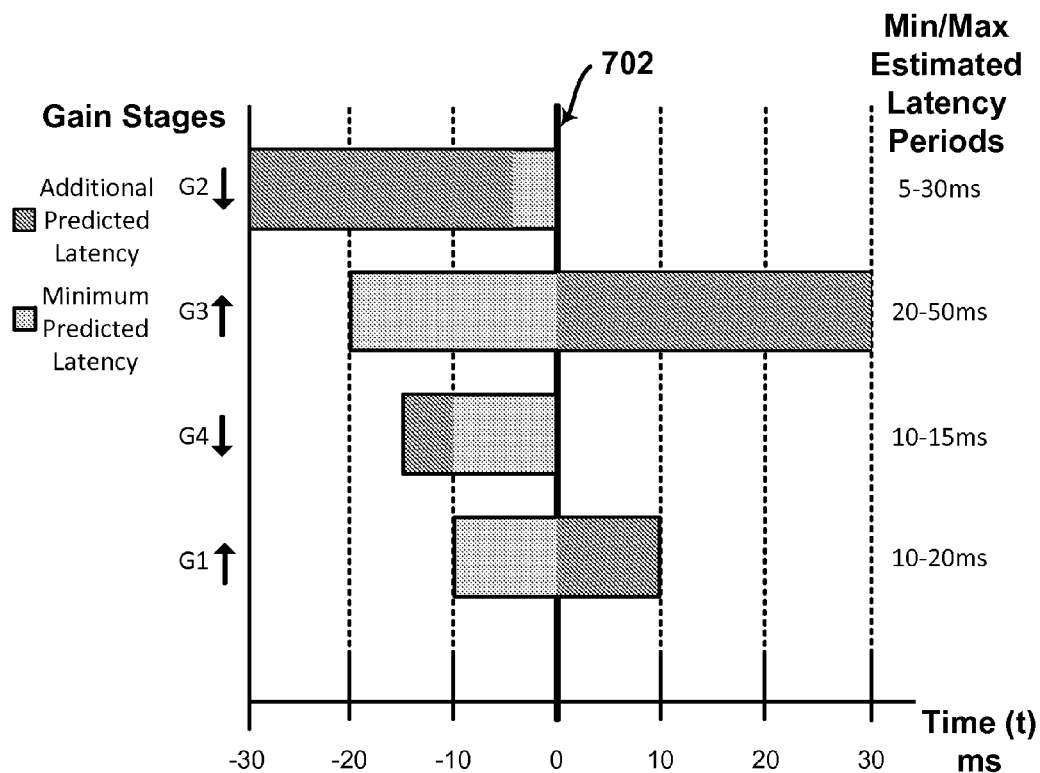

Now referring to FIGS. 7A and 7B, an example cascaded network of gain stages 700 is depicted in addition to a timing diagram showing a delay-synchronized volume adjustment of the same utilizing the methodology 600 of FIG. 6, in accordance with an embodiment of the present disclosure. As shown, the network 700 includes a plurality of audio sources including source 1 through source N mixed at a common stage 701. As discussed above, techniques disclosed herein are not limited to a particular number of audio sources, or gain stages per source, and the embodiment shown in FIG. 7A should not be considered limiting. In addition and as previously discussed, each audio source can be a combination of hardware and/or software.

FIG. 7B depicts a plurality of gain adjustments applied to each gain stage of the network of cascading gain stages 700 with respect to time (t), in accordance with an embodiment of the present disclosure. As shown, the network 700 is similar to the network of cascading gain stages in FIG. 5A. However, the controller 104 may not have the ability to retrieve/determine an operating delay for one or more gain stages of the network 700. In such cases, the controller 104 may estimate an operating delay range for each respective gain stage utilizing act 604 of FIG. 6. As shown, the merged queue resulting from act 608 includes each gain stage in a descending order (e.g., G2, G3, G4 and G1), discussed above with regard to FIG. 6. Also as shown, the gain stage G2 is to be adjusted downwards and has the longest maximum predicted operating delay of those gain stages to be adjusted downwards. To this end, this predicted operating delay is then $T_{LongestLatency}$. Also note, the synchronization point 702 ($T_0$) is thus defined as a point in time which is also equal to $T_{LongestLatency}$. The timing and adjustment of each depicted gain stage within the example timing diagram of FIG. 7B will now be discussed in turn. As shown, gain stage G2 is applied by the controller 104 at an earliest point (e.g., as a notification sound is mixed at the output stage 206) based on Equation (2). After 10 ms, an upward adjustment to gain stage G3 is applied by the controller 104. Note, utilizing Equation (3), the adjustment to gain stage G3 is timed such that the minimum predicted latency period elapses substantially at the synchronization point 702. To this end, the controller 104 is optimistically performing an upward adjustment based on the probability that no audible change will occur until at least the synchronization point 702. Note, the additional predicted latency of gain stage G3 (30 ms) is thus a worst-case prediction of how long before the gain adjustment fully propagates through gain stage G3. Continuing the example shown, the downward adjustment of gain stage G4 is scheduled based on Equation (2) discussed above. Accordingly, the adjustment of gain stage G4 propagates such that the predicted worst-case latency period (e.g., maximum predicted latency) of 15 ms elapses substantially at the synchronization point 702. Finally, the upward adjustment of gain stage G1 is calculated by Equation (3) and propagates similarly to the adjustment discussed above with regard to gain stage G3 such that no audible change will be perceived until at least the synchronization point 702 if not at some point between $T_0$ and $T_0$+10 ms (the additional predicted latency period). So, the methodology 700 of FIG. 7 enables synchronous adjustment of gain stages across a cascaded network of gain stages having variant delays by utilizing predicted latency periods such that volume is pulled down to eliminate or otherwise mitigate a perceivable upward shift in volume (e.g., a volume spike) as gain adjustments propagate through a network of cascaded gain stages.

Example System

Figure 8:
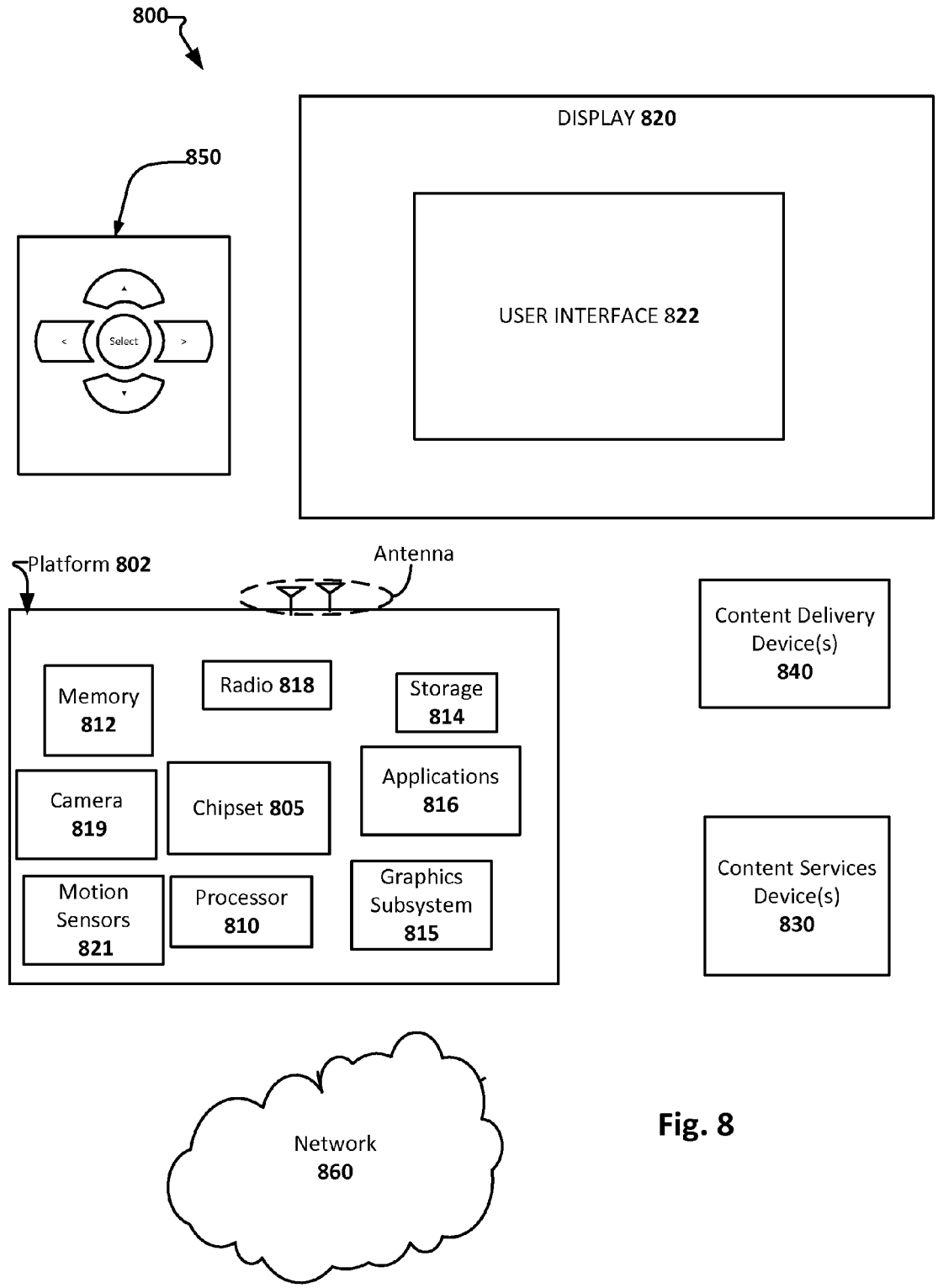
FIG. 8 illustrates a computer system configured with delay-synchronized gain adjustment techniques disclosed herein, in accordance with an example embodiment of the present disclosure.

FIG. 8 illustrates a computing system 800 implemented with a delay-synchronized volume adjustment system using the techniques disclosed herein, in accordance with various example embodiments. For example, system 800 may be incorporated into a personal computer (PC), laptop computer, wearable computing device, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, set-top box, game console, or other such computing environments capable of performing graphics rendering operations and displaying content.

In some embodiments, system 800 comprises a platform 802 coupled to a display 820. Platform 802 may receive content from a content device such as content services device(s) 830 or content delivery device(s) 840 or other similar content sources. A navigation controller 850 comprising one or more navigation features may be used to interact with, for example, platform 802 and/or display 820, so as to supplement navigational gesturing by the user. Each of these example components is described in more detail below.

In some embodiments, platform 802 may comprise any combination of a chipset 805, processor 810, memory 812, storage 814, graphics subsystem 815, camera 819, motion sensors 821, applications 816 and/or radio 818. Chipset 805 may provide intercommunication among processor 810, memory 812, storage 814, graphics subsystem 815, applications 816 and/or radio 818. For example, chipset 805 may include a storage adapter (not depicted) capable of providing intercommunication with storage 814.

Processor 810 may be implemented, for example, as Complex Instruction Set Computer (CISC) or Reduced Instruction Set Computer (RISC) processors, x86 instruction set compatible processors, multi-core, or any other microprocessor or central processing unit (CPU). In some embodiments, processor 810 may comprise dual-core processor(s), dual-core mobile processor(s), and so forth. Memory 812 may be implemented, for instance, as a volatile memory device such as, but not limited to, a Random Access Memory (RAM), Dynamic Random Access Memory (DRAM), or Static RAM (SRAM). Storage 814 may be implemented, for example, as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In some embodiments, storage 814 may comprise technology to increase the storage performance enhanced protection for valuable digital media when multiple hard drives are included, for example.

Graphics subsystem 815 may perform processing of images such as still or video for display, and in some embodiments is configured to synthesize face images, as variously described herein. Graphics subsystem 815 may be a graphics processing unit (GPU) or a visual processing unit (VPU), for example. An analog or digital interface may be used to communicatively couple graphics subsystem 815 and display 820. For example, the interface may be any of a High-Definition Multimedia Interface, DisplayPort, wireless HDMI, and/or wireless HD compliant techniques. Graphics subsystem 815 could be integrated into processor 810 or chipset 805. Graphics subsystem 815 could be a stand-alone card communicatively coupled to chipset 805. The graphics and/or video processing techniques, including the techniques for identifying and producing preferred face orientations described herein, may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 818 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 818 may operate in accordance with one or more applicable standards in any version.

In some embodiments, content services device(s) 830 may be hosted by any national, international and/or independent service and thus accessible to platform 802 via the Internet or other network, for example. Content services device(s) 830 may be coupled to platform 802 and/or to display 820. Platform 802 and/or content services device(s) 830 may be coupled to a network 860 to communicate (e.g., send and/or receive) media information to and from network 860. Content delivery device(s) 840 also may be coupled to platform 802 and/or to display 820. In some embodiments, content services device(s) 830 may comprise a cable television box, personal computer, network, telephone, Internet enabled devices or appliance capable of delivering digital information and/or content, and any other similar device capable of unidirectionally or bidirectionally communicating content between content providers and platform 802 and/display 820, via network 860 or directly. It will be appreciated that the content may be communicated unidirectionally and/or bidirectionally to and from any one of the components in system 800 and a content provider via network 860. Examples of content may include any media information including, for example, video, music, graphics, text, medical and gaming content, and so forth.

Content services device(s) 830 receives content such as cable television programming including media information, digital information, and/or other content. Examples of content providers may include any cable or satellite television or radio or Internet content providers. The provided examples are not meant to limit the present disclosure. In some embodiments, platform 802 may receive control signals from navigation controller 850 having one or more navigation features. The navigation features of controller 850 may be used to interact with user interface 822, for example. In some embodiments, navigation controller 850 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures, facial expressions, or sounds.

Movements of the navigation features of controller 850 may be echoed on a display (e.g., display 820) by movements of a pointer, cursor, focus ring, or other visual indicators displayed on the display. For example, under the control of software applications 816, the navigation features located on navigation controller 850 may be mapped to virtual navigation features displayed on user interface 822, for example. In some embodiments, controller 850 may not be a separate component but integrated into platform 802 and/or display 820. Embodiments, however, are not limited to the elements or in the context shown or described herein, as will be appreciated.

In some embodiments, drivers (not shown) may comprise technology to enable users to instantly turn on and off platform 802 like a television with the touch of a button after initial boot-up, when enabled, for example. Program logic may allow platform 802 to stream content to media adaptors or other content services device(s) 830 or content delivery device(s) 840 when the platform is turned "off." In addition, chipset 805 may comprise hardware and/or software support for 5.1 surround sound audio and/or high definition 7.1 surround sound audio, for example. Drivers may include a graphics driver for integrated graphics platforms. In some embodiments, the graphics driver may comprise a peripheral component interconnect (PCI) express graphics card.

In various embodiments, any one or more of the components shown in system 800 may be integrated. For example, platform 802 and content services device(s) 830 may be integrated, or platform 802 and content delivery device(s) 840 may be integrated, or platform 802, content services device(s) 830, and content delivery device(s) 840 may be integrated, for example. In various embodiments, platform 802 and display 820 may be an integrated unit. Display 820 and content service device(s) 830 may be integrated, or display 820 and content delivery device(s) 840 may be integrated, for example. These examples are not meant to limit the present disclosure.

In various embodiments, system 800 may be implemented as a wireless system, a wired system, or a combination of both. When implemented as a wireless system, system 800 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 800 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 802 may establish one or more logical or physical channels to communicate information. The information may include media information and control information. Media information may refer to any data representing content meant for a user. Examples of content may include, for example, data from a voice conversation, videoconference, streaming video, email or text messages, voice mail message, alphanumeric symbols, graphics, images (e.g., selfies, etc.), video, text and so forth. Control information may refer to any data representing commands, instructions or control words meant for an automated system. For example, control information may be used to route media information through a system, or instruct a node to process the media information in a predetermined manner (e.g., using hardware assisted for privilege access violation checks as described herein). The embodiments, however, are not limited to the elements or context shown or described in FIG. 8.

Figure 9:
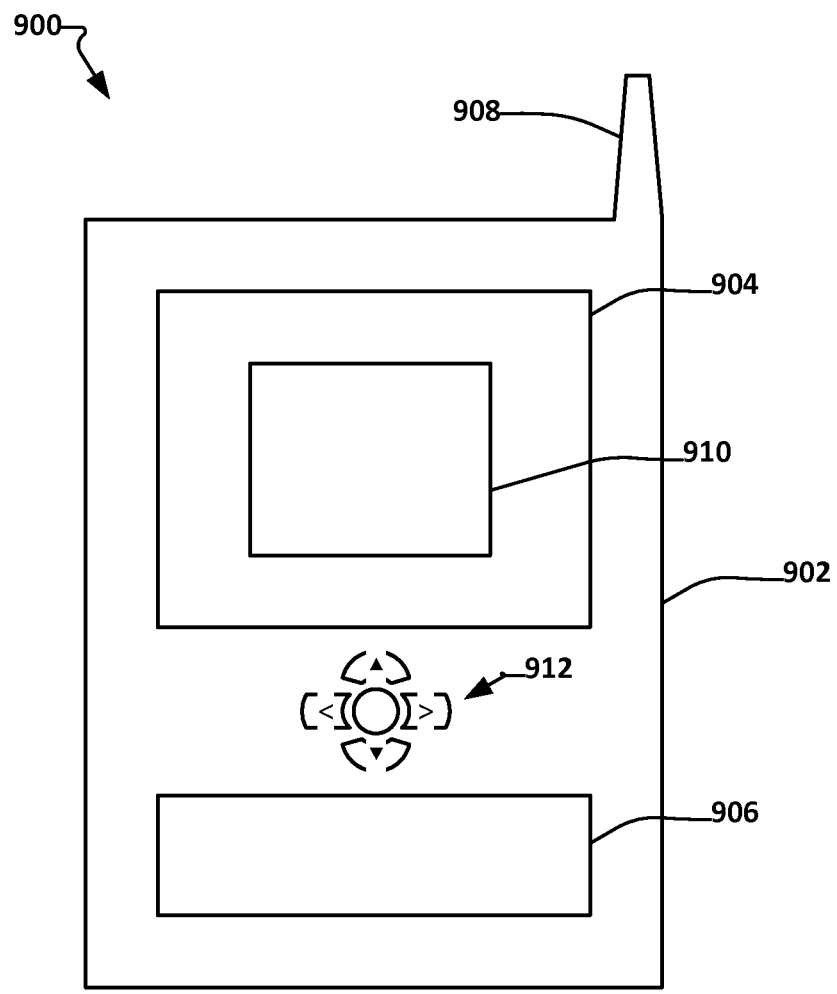
FIG. 9 shows a mobile computing system configured in accordance with an embodiment of the present disclosure.

As described above, system 800 may be embodied in varying physical styles or form factors. FIG. 9 illustrates embodiments of a small form factor device 900 in which system 800 may be embodied. In some embodiments, for example, device 900 may be implemented as a mobile computing device having wireless capabilities. A mobile computing device may refer to any device having a processing system and a mobile power source or supply, such as one or more batteries, for example.

As previously described, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In some embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 9, mobile electronic device 900 may comprise a housing 902, a display 904, an input/output (I/O) device 906, and an antenna 908. Device 900 also may comprise navigation features 912. Display 904 may comprise any suitable display unit for displaying information appropriate for a mobile computing device, which in one example embodiment is a touchscreen display. I/O device 906 may comprise any suitable I/O device for entering information into a mobile computing device. Examples for I/O device 906 may include an alphanumeric keyboard, a numeric keypad, a touch pad, input keys, buttons, a camera, switches, rocker switches, microphones, speakers, voice recognition device and software, and so forth. Information also may be entered into device 900 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, systems on-chip, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Whether hardware elements and/or software elements are used may vary from one embodiment to the next in accordance with any number of factors, such as desired computational rate, power levels, heat tolerances, processing cycle budget, input data rates, output data rates, memory resources, data bus speeds and other design or performance constraints.

Some embodiments may be implemented, for example, using a machine-readable medium or article which may store an instruction or a set of instructions that, if executed by a machine, may cause the machine to perform a method and/or operations in accordance with an embodiment of the present disclosure. Such a machine may include, for example, any suitable processing platform, computing platform, computing device, processing device, computing system, processing system, computer, processor, or the like, and may be implemented using any suitable combination of hardware and software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of executable code implemented using any suitable high-level, low-level, object-oriented, visual, compiled and/or interpreted programming language.

Further Example Embodiments

The following examples pertain to further embodiments, from which numerous permutations and configurations will be apparent.

Example 1 is an audio device, the device comprising a plurality of gain stages, the plurality of gain stages forming a cascaded arrangement of gain stages, where an output of at least two gain stages of the plurality of gain stages is coupled to an input of a shared gain stage, and a controller communicatively coupled to the plurality of gain stages, the controller including a delay-synchronized gain adjustment mode configured to determine an operating delay associated with each gain stage of the plurality of gain stages, and to apply a volume adjustment to each gain stage of the plurality of gain stages relative to a corresponding operating delay such that volume adjustments for each gain stage are applied in a synchronized manner.

Example 2 includes the subject matter of Example 1, where the volume adjustments are applied in a synchronized manner such that the volume adjustments for each gain stage fully propagate at a same point in time within a given tolerance.

Example 3 includes the subject matter of Example 2, where the given tolerance is 10% or less, such that a fastest volume adjustment propagation time associated with a multiple audio stream event is within 10% or less of a slowest volume adjustment propagation time associated with that multiple audio stream event.

Example 4 includes the subject matter of Examples 1-3, where each gain stage of the plurality of gain stages comprises at least one of a microcontroller unit (MCU), a digital signal processor (DSP), a graphics processing unit (GPU), a microprocessor, an audio codec, and an amplifier.

Example 5 includes the subject matter of Examples 1-4, further comprising a speaker device, where an output of the shared gain stage is coupled to the speaker device.

Example 6 includes the subject matter of Examples 1-5, where each gain stage of the plurality of gain stages is configured to perform signal processing on a first audio signal received at an input and output a second audio signal having a different gain level than the first audio signal.

Example 7 includes the subject matter of Examples 1-6, where the controller is configured to adjust operating parameters of each gain stage of the plurality of gain stages.

Example 8 includes the subject matter of Examples 1-7, where the plurality of gain stages comprise a first audio source and a second audio source.

Example 9 includes the subject matter of Example 8, where the first audio source and the second audio source comprise a first chip and a second chip, and where the first chip has a different clock than the second chip.

Example 10 includes the subject matter of Examples 8-9, where each gain stage of the first audio source includes an operating delay different from each gain stage of the second audio source.

Example 11 includes the subject matter of Examples 1-10, where the shared gain stage is user-controlled through a master volume control.

Example 12 includes the subject matter of Examples 1-11, where the device further comprises a memory, and where a representation of a topology of the cascaded arrangement of gain stages is stored in the memory, and where the topology includes an operating delay associated with one or more gain stages of the plurality of gain stages.

Example 13 includes the subject matter of Examples 1-12, where the controller is communicatively coupled to the plurality of gain stages through a communication channel, the communication channel being at least one of a hardware bus, a software interface, and an application programming interface (API).

Example 14 includes the subject matter of Examples 1-13, where the controller acquires an operating delay from each gain stage of the plurality of gain stages through the communication channel.

Example 15 is a system-on-chip (SOC) comprising the device as defined in any of the preceding examples.

Example 16 is a mobile computing device comprising the device as defined in any of the preceding examples.

Example 17 includes the subject matter of Example 16, where the mobile computing device is one of a wearable device, smartphone, tablet, or laptop computer.

Example 18 is a computer-implemented method for adjusting gain levels in a cascaded network of gain stages, the method comprising traversing, by a processor, the cascaded network of gain stages, the cascaded network of gain stages comprising at least a first audio source and a second audio source, each of the first and second audio sources having at least one gain stage and an output being coupled to a shared gain stage, determining an operating delay for each gain stage of the cascaded network of gain stages, and applying a volume adjustment to each gain stage of the cascaded network of gain stages relative to a corresponding operating delay such that volume adjustments for each gain stage are applied in a synchronized manner.

Example 19 includes the subject matter of Example 18, where the volume adjustments are applied in a synchronized manner such that the volume adjustments for each gain stage fully propagate at a same point in time within a given tolerance.

Example 20 includes the subject matter of Example 19, where the given tolerance is 10% or less, such that a fastest volume adjustment propagation time associated with a multiple audio stream event is within 10% or less of a slowest volume adjustment propagation time associated with that multiple audio stream event.

Example 21 includes the subject matter of Examples 18-20, where the act of traversing the cascaded network of gain stages further includes communicating with each gain stage through a communication channel to receive an operating delay associated with each gain stage.

Example 22 includes the subject matter of Examples 18-21, where the act of traversing the cascaded network of gain stages further includes retrieving from a memory a topology representing the cascaded network of gain stages, the topology including an operating delay corresponding to at least one gain stage.

Example 23 includes the subject matter of Examples 18-22, where the operating delays associated with gain stages of the first audio source are different than the operating delays associated with gain stages of the second audio source.

Example 24 includes the subject matter of Examples 18-23, where the act of determining the operating delay for each gain stage of the cascaded network of gain stages includes estimating a predicted operating delay for each gain stage, where each predicted operating delay includes a minimum predicted operating delay and a maximum predicted operating delay.

Example 25 includes the subject matter of Example 24, where the act of applying a volume adjustment to each gain stage of the cascaded network of gain stages further comprises determining if a given adjustment is a decrease in gain and queuing those adjustments in a first priority queue, determining if given adjustment is an increase in gain and queuing those adjustments in a second priority queue, and merging the first and second priority queue, where the merged priority queue prioritizes downward gain adjustments.

Example 26 includes the subject matter of Example 25, where the act of applying a volume adjustment to each gain stage the cascaded network of gain stages further comprises applying all gain decreases according to the order of the merged priority queue such that each gain decrease fully propagates at a same point in time within a given tolerance, and synchronously applying all gain increases such that a minimum predicted operating delay for each corresponding gain stage elapses at the same point in time.

Example 27 is at least one non-transient computer program product encoded with instructions that when executed by one or more processors cause a process to be carried out, the process comprising traversing, by a processor, a cascaded network of gain stages, the network of cascaded gain stages comprising at least a first audio source and a second audio source, each of the first and second audio source having at least one gain stage and an output being coupled to a shared gain stage, estimating a predicted minimum and maximum operating delay for each gain stage of the cascaded network of gain stages, and prioritizing adjustments that decrease the volume of an output audio signal of the first audio source such that volume adjustments for each respective gain stage fully propagate at a same point in time within a given tolerance prior to fully propagating adjustments for each respective gain stage that increase the volume level of an output audio signal of the second audio source.

Example 28 includes the subject matter of Example 27, where the prioritized adjustments decrease the volume of the output audio signal of the first audio source based on each predicted maximum operating delay, and synchronously increase the volume of the output audio signal of the second audio source such that the output audio signal of the second audio source becomes audible to a user substantially when the decrease to the volume of the output audio signal of the first audio source fully propagates, or shortly thereafter.

Example 29 includes the subject matter of Examples 27-28, where the given tolerance is 10% or less, such that a fastest volume adjustment propagation time associated with a multiple audio stream event is within 10% or less of a slowest volume adjustment propagation time associated with that multiple audio stream event.

Example 30 includes the subject matter of Examples 27-29, where the act of prioritizing adjustments further comprises determining if a given adjustment is a decrease in gain and queuing those adjustments in a first priority queue, determining if given adjustment is an increase in gain and queuing those adjustments in a second priority queue, and merging the first and second priority queue, where the merged priority queue prioritizes downward gain adjustments.

Example 31 includes the subject matter of Example 30, where the act of prioritizing adjustments further comprises applying all gain decreases according to the order of the merged priority queue such that each gain decrease fully propagates at a same point in time within a given tolerance, and synchronously applying all gain increases such that a minimum predicted operating delay for each corresponding gain stage elapses at the same point in time within a given tolerance.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An audio device, the device comprising:
   a cascaded arrangement of gain stages, wherein an output of at least two of the gain stages is coupled to an input of a shared one of the gain stages; and
   a controller communicatively coupled to the gain stages, the controller including a delay-synchronized gain adjustment mode configured to determine an operating delay associated with each of the gain stages, and to apply a volume adjustment to each of the gain stages relative to a corresponding said operating delay such that the volume adjustments are applied in a synchronized manner.

2. The device of claim 1, wherein the controller is configured to apply the volume adjustments in the synchronized manner such that the volume adjustments fully propagate at a same point in time within a given tolerance.

3. The device of claim 2, wherein the given tolerance is 10% of a difference between a fastest volume adjustment propagation time associated with a multiple audio stream event and a slowest volume adjustment propagation time associated with that multiple audio stream event.

4. The device of claim 1, wherein each of the gain stages comprises at least one of a microcontroller unit (MCU), a digital signal processor (DSP), a graphics processing unit (GPU), a microprocessor, an audio codec, and an amplifier.

5. The device of claim 1, further comprising a first audio source including a first one or more of the gain stages and a second audio source including a second one or more of the gain stages, wherein the operating delay of each of the first one or more of the gain stages is different from the operating delay of each of the second one or more of the gain stages.

6. The device of claim 1, wherein the controller is communicatively coupled to the gain stages through a communication channel, the communication channel being at least one of a hardware bus, a software interface, and an application programming interface (API).

7. The device of claim 6, wherein the controller is configured to acquire the operating delay from each of the gain stages through the communication channel.

8. A system-on-chip (SOC) comprising the device of claim 1.

9. A mobile computing device comprising the SOC of claim 8, wherein the mobile computing device is one of a wearable device, smartphone, tablet, or laptop computer.

10. A computer-implemented method for adjusting gain levels in a cascaded network of gain stages, an output of at least two of the gain stages being coupled to an input of a shared one of the gain stages, the method comprising:
traversing, by a processor, the cascaded network of gain stages;
determining, by the processor, an operating delay for each of the gain stages; and
applying, by the processor, a volume adjustment to each of the gain stages relative to a corresponding said operating delay such that the volume adjustments are applied in a synchronized manner.

11. The method of claim 10, further comprising applying, by the processor, the volume adjustments in the synchronized manner such that the volume adjustments fully propagate at a same point in time within a given tolerance.

12. The method of claim 11, wherein the given tolerance is 10% of a difference between a fastest volume adjustment propagation time associated with a multiple audio stream event and a slowest volume adjustment propagation time associated with that multiple audio stream event.

13. The method of claim 10, wherein the traversing of the cascaded network of gain stages comprises acquiring the operating delay from each of the gain stages through a communication channel.

14. The method of claim 10, wherein the traversing of the cascaded network of gain stages comprises retrieving from a memory a topology representing the cascaded network of gain stages, the topology including the operating delay from at least one of the gain stages.

15. The method of claim 10, wherein a first audio source comprises a first one or more of the gain stages and a second audio source comprises a second one or more of the gain stages, the operating delays of the first one or more of the gain stages being different than the operating delays of the second one or more of the gain stages.

16. The method of claim 10, wherein the determining of the operating delay for each of the gain stages comprises estimating a predicted said operating delay for each of the gain stages, wherein each predicted operating delay includes a minimum predicted operating delay and a maximum predicted operating delay.

17. The method of claim 16, wherein the applying of the volume adjustments comprises:
determining which of the volume adjustments are gain decreases and queuing those adjustments in a first priority queue;
determining which of the volume adjustments are gain increases and queuing those adjustments in a second priority queue; and
merging the first and second priority queues into a merged priority queue, the merged priority queue prioritizing those of the volume adjustments that are the gain decreases.

18. The method of claim 17, wherein the applying of the volume adjustments further comprises applying all the gain decreases according to the merged priority queue such that the gain decreases fully propagate at a same first point in time within a given tolerance, and synchronously applying all the gain increases according to the merged priority queue such that corresponding ones of the minimum predicted operating delays elapse at the first point in time.

19. At least one non-transient computer program product encoded with instructions that when executed by one or more processors cause a process to be carried out, the process comprising:
traversing a cascaded network of gain stages comprising at least a first gain stage in a first audio source and a second gain stage in a second audio source, an output from each of the first gain stage and the second gain stage being coupled to a shared one of the gain stages;
estimating predicted minimum and maximum operating delays for each of the gain stages;
prioritizing decreasing volume adjustments of corresponding ones of the gain stages that decrease volume of an output audio signal of the first audio source such that the decreasing volume adjustments fully propagate at a same first point in time within a given tolerance; and
prioritizing increasing volume adjustments of corresponding ones of the gain stages that increase volume of an output audio signal of the second audio source such that the increasing volume adjustments fully propagate no sooner than the first point in time.

20. The computer program product of claim 19, wherein the prioritized decreasing volume adjustments decrease the volume of the output audio signal of the first audio source based on corresponding ones of the predicted maximum operating delays, and the prioritized increasing volume adjustments increase the volume of the output audio signal of the second audio source based on corresponding ones of the predicted minimum operating delays such that the output audio signal of the second audio source becomes audible to a user substantially when the decrease to the volume of the output audio signal of the first audio source fully propagates, or shortly thereafter.

* * * * *